(12) United States Patent
Novoselov (10) Patent No.: US 9,625,703 B1
(45) Date of Patent: Apr. 18, 2017

(54) PIXEL WALL CONFIGURATION FOR AN ELECTROWETTING DISPLAY

(71) Applicant: Amazon Technologies, Inc., Seattle, WA (US)

(72) Inventor: Pavel Novoselov, Eindhoven (NL)

(73) Assignee: Amazon Technologies, Inc., Seattle, WA (US)

( * ) Notice: Subject to any disclaimer, the term of this patent is extended or adjusted under 35 U.S.C. 154(b) by 21 days.

(21) Appl. No.: 14/561,117

(22) Filed: Dec. 4, 2014

(51) Int. Cl.
*G02B 26/00* (2006.01)
*G02B 26/02* (2006.01)
*G03F 7/16* (2006.01)
*G03F 7/20* (2006.01)
*G03F 7/40* (2006.01)

(52) U.S. Cl.
CPC ............. *G02B 26/005* (2013.01); *G03F 7/16* (2013.01); *G03F 7/20* (2013.01); *G03F 7/40* (2013.01)

(58) Field of Classification Search
CPC ................ G02B 26/005; G02B 26/004; G02B 2207/115; G02B 26/00; G09G 3/348
USPC .................. 359/290–292, 228, 26.3, 665
See application file for complete search history.

(56) References Cited

U.S. PATENT DOCUMENTS

| | | | |
|---|---|---|---|
| 7,646,525 B2* | 1/2010 | Cheng | G02B 26/005 345/105 |
| 8,730,225 B2* | 5/2014 | Bae | G02B 26/005 345/211 |
| 8,842,360 B2* | 9/2014 | Shim | G02B 26/005 359/290 |
| 2015/0355455 A1* | 12/2015 | Zhao | G02B 26/005 359/290 |

* cited by examiner

*Primary Examiner* — Tuyen Tra
(74) *Attorney, Agent, or Firm* — Lee & Hayes, PLLC (57) ABSTRACT

An electrowetting display comprises a first support plate and a second support plate, pixel regions between the first support plate and the second support plate, and two walls on the first support plate that delineate the pixel regions from one another. The two walls are separated by a gap. The electrowetting display further comprises an electrolyte solution between the first support plate and the second support plate and in the gap that separates the two walls.

20 Claims, 6 Drawing Sheets

PIXEL WALL CONFIGURATION FOR AN ELECTROWETTING DISPLAY

BACKGROUND

Electronic displays are found in numerous types of electronic devices such as electronic book ("eBook") readers, cellular telephones, smart phones, portable media players, tablet computers, wearable computers, laptop computers, netbooks, desktop computers, televisions, appliances, home electronics, automotive electronics, augmented reality devices, and so forth. Electronic displays may present various types of information, such as user interfaces, device operational status, digital content items, and the like, depending on the kind and purpose of the associated device. The appearance and quality of a display may affect a user's experience with the electronic device and the content presented thereon. Accordingly, finding ways to enhance user experience and satisfaction continues to be a priority. Moreover, increased multimedia use imposes high demands on designs, packaging, and fabricating display devices, as content available for mobile use becomes more extensive and device portability continues to be a high priority.

An electrowetting display includes an array of pixels individually bordered by pixel walls that retain liquid, such as opaque oil, for example. Light transmission through each pixel is adjustable by electronically controlling a position of the liquid in the pixel. Resolution and quality of an electrowetting display may depend on a number of factors, such as optical transmissivity or reflectivity of material layers of the electrowetting display and pixel size, just to name a few examples.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

In various embodiments described herein, electronic devices include electrowetting displays for presenting content and other information. In some examples, the electronic devices may include one or more components associated with the electrowetting display, such as a touch sensor component layered atop the electrowetting display for detecting touch inputs, a front light or back light component for lighting the electrowetting display, and/or a cover layer component, which may include antiglare properties, antireflective properties, anti-fingerprint properties, anti-cracking properties, and the like. Various embodiments described herein include techniques for assembling electronic devices including these components for the electrowetting displays and other features described herein.

In some embodiments, an electrowetting display device includes a bottom support plate and a top support plate and a plurality of pixel regions therebetween. Each of the pixel regions may include a hydrophobic surface or layer on the bottom support plate, an electrowetting oil on the hydrophobic surface, and an electrolyte solution at least partially surrounding the electrowetting oil.

Hydrophobicity refers to a degree to which a material is hydrophobic to another material. Even though a material may be called "hydrophobic", such a material can be more accurately described by its hydrophobicity, or how hydrophobic it is toward another material, for example. Thus, herein, even though a material is called hydrophobic, the hydrophobicity of the material may be less than 100% (e.g., it does not mean that the material is 100% hydrophobic).

Bottom portions of pixel regions may be partitioned or delineated from one another by dual pixel walls disposed on the bottom support plate. In contrast to a single pixel wall that partitions pixel regions from one another, a dual pixel wall includes two substantially parallel walls and a gap therebetween. Herein, parallel walls may be substantially parallel. For example, substantially parallel walls may deviate from parallelism by a few degrees. In other words, adjacent pixel regions may be separated from one another by a wall, a gap, and another wall. The wall-gap-wall structure is herein called a dual pixel wall.

The gap of dual pixel walls may have an affinity for the electrolyte solution so that the electrolyte solution may "adhere" to surfaces of the gap. A liquid (e.g., electrolyte solution) may be considered to be adhering to a surface (e.g., pixel wall surface) based, at least in part, on a wettability of the surface. For example, surfaces of the gap of dual pixel walls may be hydrophilic with respect to the electrolyte solution so that the wettability of the surfaces is relatively high for the electrolyte solution. Accordingly, the electrolyte solution may tend to adhere to the surfaces. A tendency of the electrolyte solution to adhere to surfaces is referred to as "pinning".

Electrolyte solution in the region of a dual pixel wall may be pinned to the dual pixel wall by the hydrophilic properties of the gap of the dual pixel wall. The electrolyte solution being pinned in this region provides a benefit by resisting flow of electrowetting oil that may otherwise "spill over" the dual pixel wall from a pixel region to an adjacent pixel region.

In a number of embodiments, a display device, such as an electrowetting display device, may be a transmissive, reflective or transflective display that generally includes an array of pixels (e.g., or subpixels) configured to be operated by an active matrix addressing scheme. For example, rows and columns of electrowetting elements are operated by controlling voltage levels on a plurality of source lines and gate lines. In this fashion, the display device may produce an image by selecting particular pixels to at least partly transmit, reflect or block light. Pixels are addressed (e.g., selected) via rows and columns of the source lines and gate lines that are electrically connected to transistors (e.g., used as switches) included in each pixel. Transistors take up a relatively small fraction of the area of each pixel. For example, the transistor may be located underneath the reflector in reflective displays. Herein, a pixel may, unless otherwise specified, comprise a single subpixel or a pixel that includes two or more subpixels or subpixel of an electrowetting display device. Such a pixel or subpixel may be the smallest light transmissive, reflective or transflective element of a display that is individually operable to directly control an amount of light transmission through or reflection from the element. For example, in some implementations, a pixel may be a pixel that includes a red subpixel, a green subpixel, and a blue subpixel. In other implementations, a pixel may be a pixel that is a smallest component, e.g., the pixel does not include any subpixels.

Electrowetting displays include an array of pixels comprising pixels and/or subpixels sandwiched between two support plates, such as a substrate and a top plate. For example, the substrate may be a bottom support plate that, in cooperation with the top plate, contains pixels that include electrowetting oil, electrolyte solution and dual pixel walls between the support plates. Support plates may include glass, plastic (e.g., a transparent thermoplastic such as PMMA or other acrylic), or other transparent material and may be made of a rigid or flexible material, for example.

Pixels include various layers of materials built upon a bottom support plate. One such layer may be a hydrophobic layer like amorphous fluoropolymer (AF).

Hereinafter, example embodiments include reflective electrowetting displays that include a clear top support plate and a bottom support plate, which need not be transparent. The clear top support plate may comprise glass or any of a number of transparent materials, such as plastic, quartz, semiconductors, and so on, and claimed subject matter is not limited in this respect. "Top" and "bottom", as used herein to identify the support plates of an electrowetting display, do not necessarily refer to a direction referenced to gravity or to a viewing side of the electrowetting display. Also, as used herein for sake of convenience of describing example embodiments, the top support plate is that through which viewing of pixels of a (reflective) electrowetting display occurs.

In some embodiments, a reflective electrowetting display comprises an array of pixels sandwiched between a bottom support plate and a top support plate. The bottom support plate may be opaque while the top support plate is transparent. Herein, describing an element or material as being "transparent" means that the element or material may transmit a relatively large fraction of the light incident upon it. For example, a transparent substrate or layer may transmit more than 70% or 80% of the light impinging on its surface, though claimed subject matter is not limited in this respect.

Dual pixel walls retain at least a first fluid which is electrically non-conductive, such as opaque or colored oil, in the individual pixels. A cavity formed between the support plates is filled with the first fluid (e.g., retained by dual pixel walls) and a second fluid (e.g., considered to be an electrolyte solution) that is electrically conductive or polar and may be a water solution or a salt solution, such as a solution of potassium chloride in water. The second fluid may be transparent, but may be colored, or light-absorbing. The second fluid may be immiscible with the first fluid.

In some embodiments, individual reflective electrowetting pixels may include a reflective layer on the bottom support plate of the electrowetting pixel, a transparent electrode layer adjacent to the reflective layer, and a hydrophobic layer on the electrode layer. Dual pixel walls of each pixel, the hydrophobic layer, and the transparent top support plate at least partially enclose a liquid region that includes an electrolyte solution and an opaque liquid, which is immiscible with the electrolyte solution. An "opaque" liquid, as described herein, is used to describe a liquid that appears black or colored to an observer. For example, a black opaque liquid strongly absorbs a broad spectrum of wavelengths (e.g., including those of red, green and blue) in the visible region of electromagnetic radiation. In some implementations, the opaque liquid is a nonpolar electrowetting oil.

The opaque liquid is disposed in the liquid region. As described in detail below, coverage area of the opaque liquid on the bottom hydrophobic layer is electronically adjustable to affect the amount of light incident on the reflective electrowetting display that reaches the reflective material at the bottom of each pixel.

In addition to pixels, spacers and edge seals may also be located between two support plates. Support plates may comprise any of a number of amorphous materials, such as plastic, glass, quartz, semiconductors, and so on, and claimed subject matter is not limited in this respect.

Spacers and edge seals which mechanically connect a first support plate with a second overlying support plate, or which form a separation between the first support plate and the second support plate, contribute to mechanical integrity of the electrowetting display. Edge seals, for example, being disposed along a periphery of an array of electrowetting display device elements, may contribute to retaining (e.g., first and second) fluids between the first support plate and the second overlying support plate. In some embodiments, a display device as described herein may comprise a portion of a system that includes one or more processors and one or more computer memories, which may reside on a control board, for example. Display software may be stored on the one or more memories and may be operable with the one or more processors to modulate light that is received from an outside source (e.g., ambient light) or out-coupled from a light guide of the display device. For example, display software may include code executable by a processor to modulate optical properties of individual pixels of the electrowetting display based, at least in part, on electronic signals representative of image or video data. The code may cause the processor to modulate the optical properties of pixels by controlling electrical signals (e.g., voltages, currents, fields, and so on) on, over, or in layers of the electrowetting display.

Figure 1:
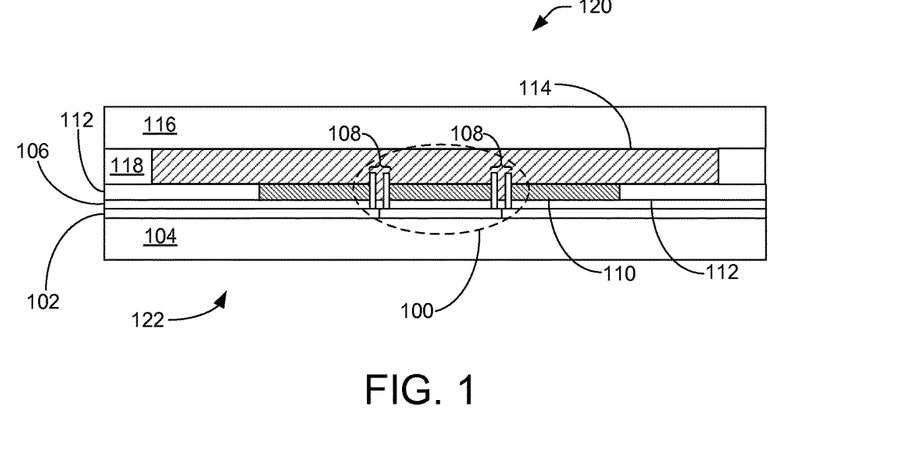
FIG. 1 illustrates a cross-section of a portion of an electrowetting display device, according to some embodiments.

FIG. 1 is a cross-section of a portion of a reflective electrowetting display device illustrating several electrowetting pixels 100, according to some embodiments. Though three such electrowetting pixels are illustrated, an electrowetting display device may include any number (usually a very large number, such as thousands or millions) of electrowetting pixels. An electrode layer 102 is formed on a substrate 104. Herein, unless a configuration is described in a particular way, a first element being "on" or "disposed on" a second element does not necessarily imply that the first element is directly on the second element with no intervening layer. For example, a first element being "on" or "disposed on" a second element may mean that the first element is directly on the second element or that other elements separate the first element from the second element. Descriptions herein provide enough detail to allow one to determine the meaning of "on" or "disposed on" for particular embodiments.

In various embodiments, electrode layer 102 may be connected to any number of thin film transistors (TFTs) (not illustrated) that are switched to either select or deselect electrowetting pixels 100 using active matrix addressing, for example. In some implementations, electrode layer 102 comprises individual electrodes, each electrode per pixel. A TFT is a particular type of field-effect transistor that includes thin films of an active semiconductor layer as well as a dielectric layer and metallic contacts over a supporting (but non-conducting) substrate, which may be glass or any of a number of other transparent or non-transparent materials, for example.

In some implementations, a dielectric barrier layer (not illustrated in FIG. 1) may at least partially separate electrode layer 102 from a hydrophobic layer 106 also formed on substrate 104. Such separation may, among other things, prevent electrolysis of the underneath electrode occurring through hydrophobic layer 106. In some implementations, hydrophobic layer 106 may comprise any of a number of types of amorphous fluoropolymers, such as AF1600, produced by DuPont, based in Wilmington, Del. Hydrophobic layer 106 may also be any of a number of water-repelling materials that affect wettability of an adjacent material, for example.

Dual pixel walls 108 form a patterned electrowetting element grid on hydrophobic layer 106. Dual pixel walls 108 may comprise a photoresist material such as, for example, epoxy-based negative photoresist SU-8. The patterned electrowetting element grid comprises rows and columns that form an array of electrowetting pixels. For example, an electrowetting pixel may have a width and length in a range of about 50 to 500 microns.

A first fluid 110, which may have a thickness in a range of about 1 to 10 microns, for example, overlies hydrophobic layer 106. First fluid 110 is partitioned by dual pixel walls 108 of the patterned electrowetting element grid. An outer rim 112 may comprise the same material as dual pixel walls 108. A second fluid 114, such as an electrolyte solution, overlies first fluid 110 and dual pixel walls 108 of the patterned electrowetting element grid. An electrolyte solution may be electrically conductive and/or polar. For example, an electrolyte solution may be, among other things, a water or a salt solution such as potassium chloride water, or a mixture of water and ethyl alcohol. First fluid 110 is immiscible with second fluid 114 so that the first fluid and the second fluid do not substantially mix with each other, and in some examples do not mix with each other to any degree. Herein, substances are immiscible with one another if the substances do not substantially form a solution. Second fluid 114 is preferably transparent, but may be colored or absorbing. First fluid 110 is electrically non-conductive and may for instance be an alkane like hexadecane or (silicone) oil.

A support plate 116 covers second fluid 114 and edge seals 118 maintain second fluid 114 over the electrowetting pixel array. Support plate 116 may be supported by edge seals 118 and spacers (not illustrated) that extend up to support plate 116 and are interspersed throughout the array of pixels 100. The support plate may be made of glass or polymer and may be rigid or flexible, for example. In some implementations, TFTs (not shown) are fabricated onto support plate 116.

A voltage applied across second fluid 114 and hydrophobic layer 106 of individual electrowetting pixels may control transmittance or reflectance of the individual electrowetting pixels.

The reflective electrowetting display device has a viewing side 120 on which an image formed by the electrowetting display device may be viewed, and a rear side 122. Support plate 116 faces viewing side 120 and support plate 104 faces rear side 122. The electrowetting display device may be an active matrix driven display type or a passive matrix driven display, just to name a few examples.

Hydrophobic layer 106 is arranged on substrate 104 to create an electrowetting surface area. The hydrophobic character causes first fluid 110 to adhere preferentially to substrate 104 since first fluid 110 has a higher wettability with respect to the surface of hydrophobic layer 106 than second fluid 114. Wettability relates to the relative affinity of a fluid for the surface of a solid. Wettability increases with increasing affinity, and it may be measured by the contact angle formed between the fluid and the solid and measured internal to the fluid of interest. For example, such a contact angle may increase from relative non-wettability of more than 90° to complete wettability at 0°, in which case the fluid tends to form a film on the surface of the solid.

First fluid 110 absorbs at least a part of the optical spectrum. First fluid 110 may be transmissive for a part of the optical spectrum, forming a color filter. For this purpose, the fluid may be colored by addition of pigment particles or dye, for example. Alternatively, first fluid 110 may be colored or black (e.g., absorbing substantially all parts of the optical spectrum) or reflecting. Hydrophobic layer 106 may be transparent or reflective. A reflective layer may reflect the entire visible spectrum, making the layer appear white, or part of it, making it have a color.

If a voltage is applied across electrowetting pixel 100, electrowetting pixel 100 will enter into an active state. Electrostatic forces will move second fluid 114 toward electrode layer 102, thereby displacing first fluid 110 from the area of hydrophobic layer 106 to dual pixel walls 108 surrounding the area of hydrophobic layer 106, to a droplet-like shape. Such displacing action uncovers first fluid 110 from the surface of hydrophobic layer 106 of electrowetting pixel 100.

If the voltage across electrowetting pixel 100 is returned to an inactive signal level of zero or a value near to zero, electrowetting pixel 100 will return to an inactive state, where first fluid 110 flows back to cover hydrophobic layer 106. In this way, first fluid 110 forms an electrically controllable optical switch in each electrowetting pixel 100. Of course, such details of an electrowetting display device are merely examples, and claimed subject matter is not limited in this respect.

Figure 2:
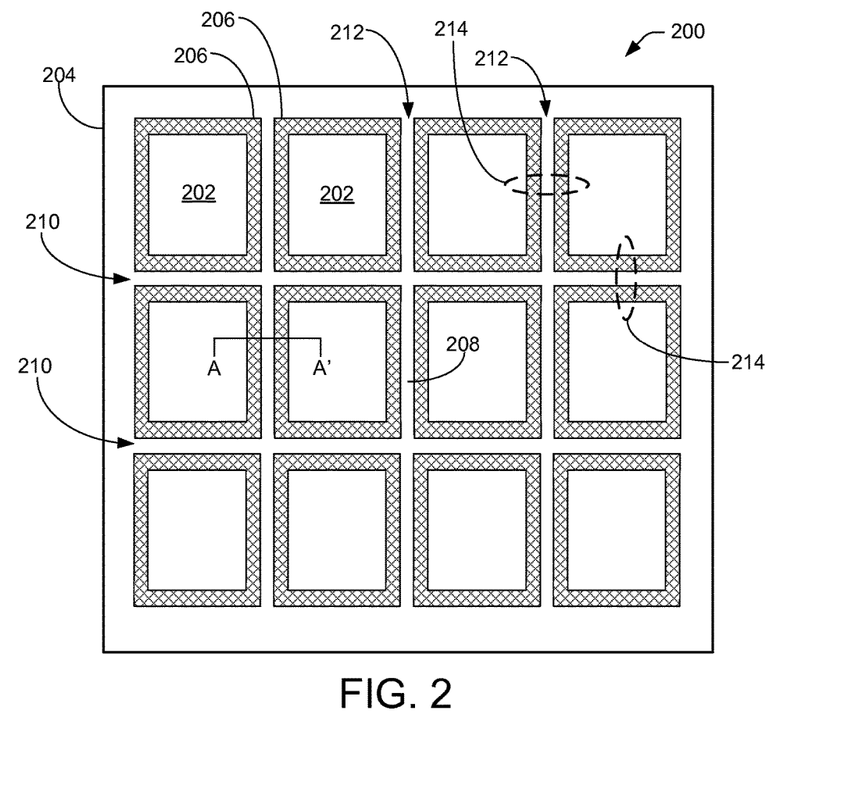
FIG. 2 is a top view of a portion of an electrowetting display device, according to various embodiments.

FIG. 2 is a top view of a pixel region 200 of an electrowetting display device, according to various embodiments. Pixel region 200 includes a number of electrowetting pixels 202 disposed on a support plate 204 (e.g., a substrate). For example, electrowetting pixels 202 may be the same as or similar to electrowetting pixel 100 illustrated in FIG. 1.

Electrowetting pixels 202 are individually surrounded by walls 206. Gaps 208 separate walls 204. An electrowetting display device may include rows 210 and columns 212 of gaps 208. Dual pixel walls 214 comprise a wall-gap-wall structure, and separate (or delineate) electrowetting pixels 202 from one another. Examples of a cross-section A-A' are described below.

Figure 3:
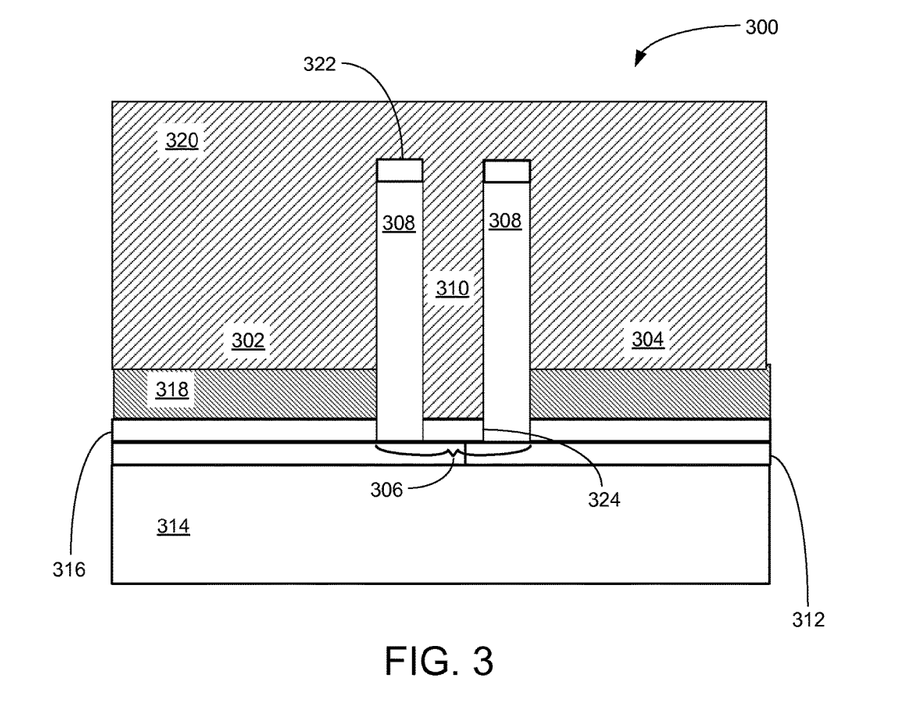
FIG. 3 is a cross-sectional view of a dual pixel wall portion of an electrowetting display device, according to some embodiments.

FIG. 3 is a cross-sectional view of a dual pixel wall portion 300 of an electrowetting display device, according to some embodiments. For example, dual pixel wall portion 300 may be the same as or similar to the portion of pixel region 200 indicated by A-A'. Pixel wall portion 300 includes a portion of a first pixel area 302 and a portion of an adjacent second pixel area 304. A dual pixel wall 306 separates first pixel area 302 and second pixel area 304 from each other. Dual pixel wall 306 includes two parallel walls 308 and a gap 310 therebetween.

In various embodiments, an electrode layer 312, which may comprise a number of sections connected to any number of TFTs (not shown) that are switched to either select or deselect electrowetting pixels of first pixel area 302 and second pixel area 304, may be disposed on a support plate 314. In some implementations, a dielectric barrier layer (not illustrated) may at least partially separate electrode layer 312 from a hydrophobic layer 316 also formed on substrate 104. Such separation may, among other things, prevent electrolysis of the electrode occurring through hydrophobic layer 316. In some implementations, hydrophobic layer 316 may be similar to or the same as hydrophobic layer 106 illustrated in FIG. 1, for example. Walls 308 may comprise a photoresist material such as, for example, epoxy-based negative photoresist SU-8.

An electrowetting oil 318, which may have a thickness in a range of about 1 to 10 microns, for example, overlies hydrophobic layer 316. Electrowetting oil 318 may be partitioned by dual pixel wall 306. An electrolyte solution 320 overlies electrowetting oil 318 and dual pixel wall 306. Electrolyte solution 320 may be electrically conductive and/or polar. Electrolyte solution 320 is immiscible with electrowetting oil 318.

In some embodiments, n hydrophobic layer 322 may at least partially cover a top (e.g., a distal end) of walls 308. Moreover, in some embodiments, n hydrophobic layer 324 may disposed on a bottom area of gap 310.

FIGS. 4-7 illustrate portions of a process for fabricating an electrowetting display device, according to some embodiments. For example, such an electrowetting display device may include dual pixel walls, such as dual pixel wall 306, illustrated in FIG. 3.

Figure 4:
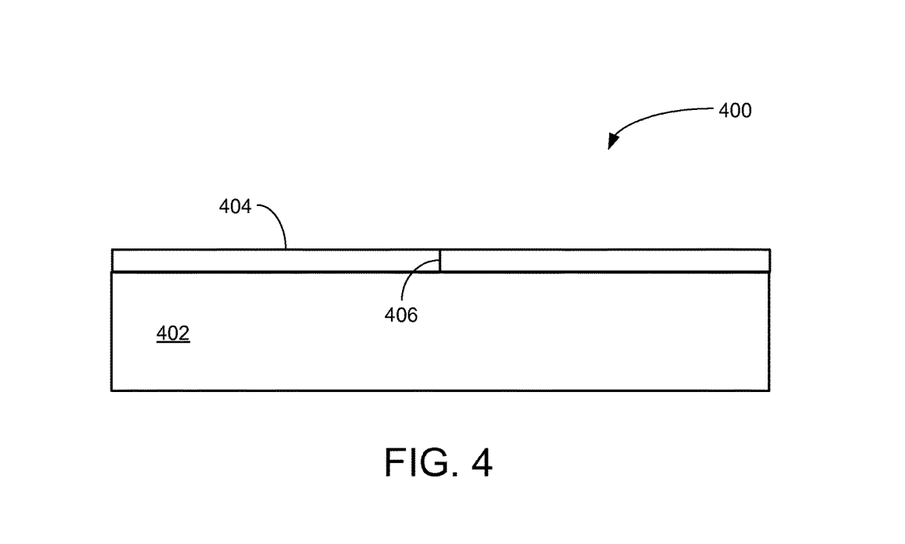
FIGS. 4-7 illustrate portions of a process for fabricating an electrowetting display, according to some embodiments.

In FIG. 4, a structure 400 includes a support plate 402 (e.g., a bottom support plate or a substrate) and an electrode layer 404. For example, electrode layer 404, which may be a metal or other conductive material (e.g., dielectric or doped semiconductor), may be deposited on support plate 402 by a deposition process. Separation line 406 represents a discontinuity of electrical conductivity along electrode layer 404. For example, a first portion 408 of electrode layer 404 may be electrically insulated or separated from a second portion 410 of electrode layer 404 so that each portion 408 and 410 is connected to a respective pixel region.

Figure 5:
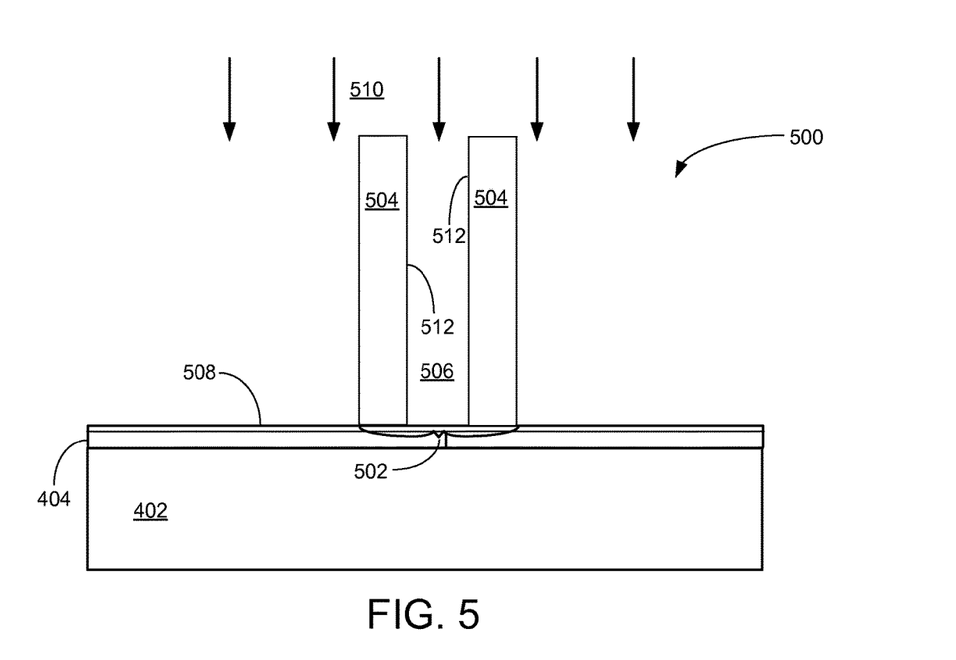

In FIG. 5, a structure 500 includes support plate 402, electrode layer 404, and a dual pixel wall 502 that includes walls 504 spaced apart by a gap 506. Dual pixel wall 502 may comprise a remaining portion of a photoresist material deposited on electrode layer 404, lithographically patterned and etched (e.g., patterning).

A dielectric barrier layer 508 may be deposited on electrode layer 404. For example, dielectric barrier layer 508 may comprise silicon dioxide and silicon nitride. In some implementations, material (e.g., photoresist) for forming dual pixel wall 502 may be deposited on dielectric barrier layer 508. In other implementations, material (e.g., photoresist) for forming dual pixel wall 502 may be deposited before dielectric barrier layer 508 is deposited on electrode layer 404. In this case, dual pixel wall 502 is disposed on electrode layer 404.

Walls 504 of dual pixel wall 502 may be subjected to an ultraviolet ozone (UV/O$_3$) treatment, as indicated by arrows 510. For example, such a UV/O$_3$ treatment may involve exposing dual pixel wall 502 to UV light and ozone, which may modify surface characteristics of dual pixel wall 502. In particular, exposing dual pixel walls 502 to UV/O$_3$ may increase wettability of the dual pixel walls with respect to an electrolyte solution. In this fashion, UV/O$_3$ treatment may lead to inside walls 512 of dual pixel wall 502 (which are the same as walls of gap 506) being relatively hydrophilic to an electrolyte solution (e.g., electrolyte solution 320, shown in FIG. 3). In addition to the hydrophilic property, capillary forces may contribute to retaining the electrolyte solution between inside walls 512. Such hydrophilicity may lead to improved adhesion or wettability between inside walls 512 and an electrolyte solution.

Figure 6:
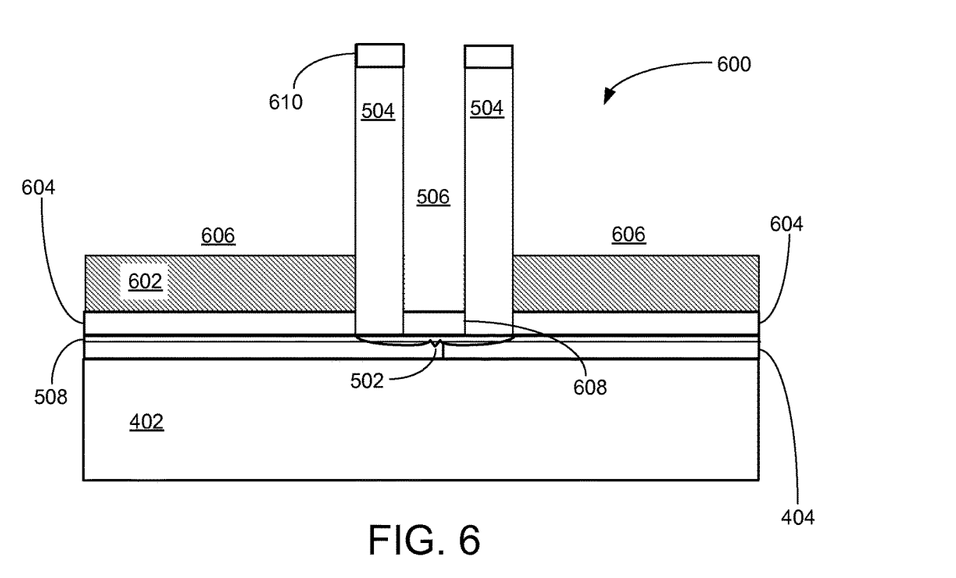

In FIG. 6, a structure 600 includes support plate 402, electrode layer 404, dielectric barrier layer 508, dual pixel wall 502, various hydrophobic layers 604/608/610, and an electrowetting oil 602. In some implementations, a hydrophobic layer 604 may be deposited onto dielectric barrier layer 508 in pixel areas 606. In other implementations, a hydrophobic layer 608 may be deposited onto dielectric barrier layer 508 between walls 504 on the bottom of gap 506. In still other implementations, a hydrophobic layer 610 may be deposited onto tops (e.g., distal ends) of walls 504 on the bottom of gap 506 of dual pixel wall 502.

Returning to FIG. 5, hydrophobic layers (e.g., hydrophobic layers 604, 608, and 610) may be deposited onto dielectric barrier layer 508 after UV/O$_3$ treatment 510. This sequence is beneficial because such a UV/O$_3$ treatment may damage hydrophobic layers if the hydrophobic layers were present before the wall deposition. This sequence also need not involve a reactive ion etching (RIE) process to fabricate walls on a hydrophobic material, such as a hydrophobic layer. A heat treatment that may follow an RIE process to reinstate hydrophobicity of an hydrophobic layer may also be damaging to the hydrophobic layer and in the proposed process the heat treatment may be omitted In FIG. 7, structure 700 is the same as structure 600 with an electrolyte solution 702 covering structure 600. For example, electrolyte solution 702 covers electrowetting oil 602, dual pixel wall 502, and fills gap 506.

Figure 7:
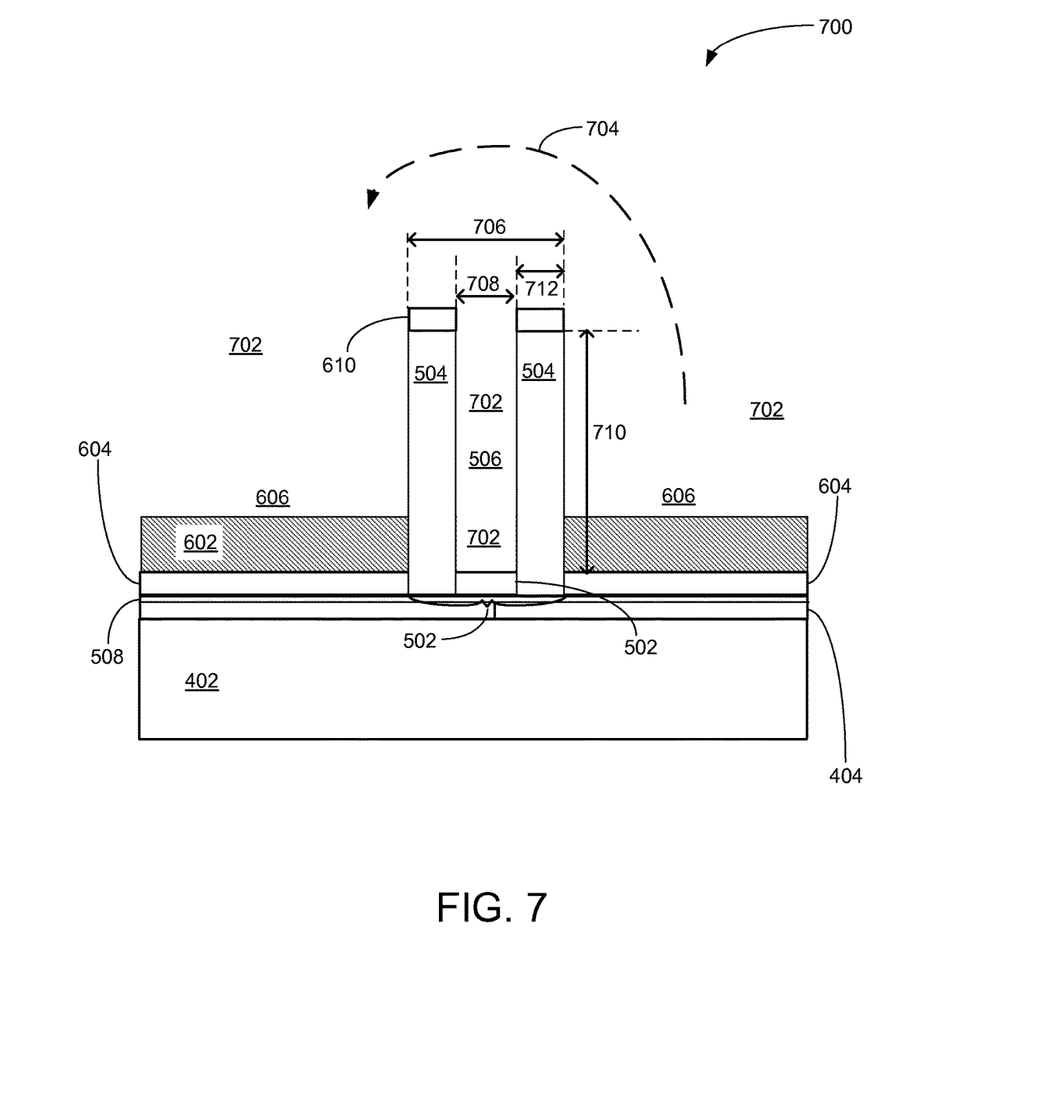

Because of adhesion properties between electrolyte solution 702 and inside walls in gap 506 of dual pixel wall 502, a region of electrolyte solution 702 in gap 506 and adjacent to a top of gap 506 may be pinned to gap 506. Such pinning may help prevent electrowetting oil 602 from "spilling" over dual pixel wall 502 from one pixel area 606 to an adjacent pixel area 606, as indicated by arrow 704. Such spilling may potentially occur resulting from physical shock (e.g., external impact) imposed on an electrowetting display device that includes structure 700, for example.

In some embodiments, a width 706 of dual pixel wall 502 may be in a range from about 4 microns up to about 7 microns. A width 708 of gap 506 may be in a range from about 1 micron up to about 3 microns. A height 710 that dual pixel wall 502 protrudes into electrolyte solution 702 (e.g., as measured in gap 506) is in a range from about 2 microns up to about 4 microns. A thickness 712 of individual walls 504 of dual pixel wall 502 may be about 2 microns. A thickness of hydrophobic layer 610 may be in a range from about 100 nanometers up to about 800 nanometers.

Figure 8:
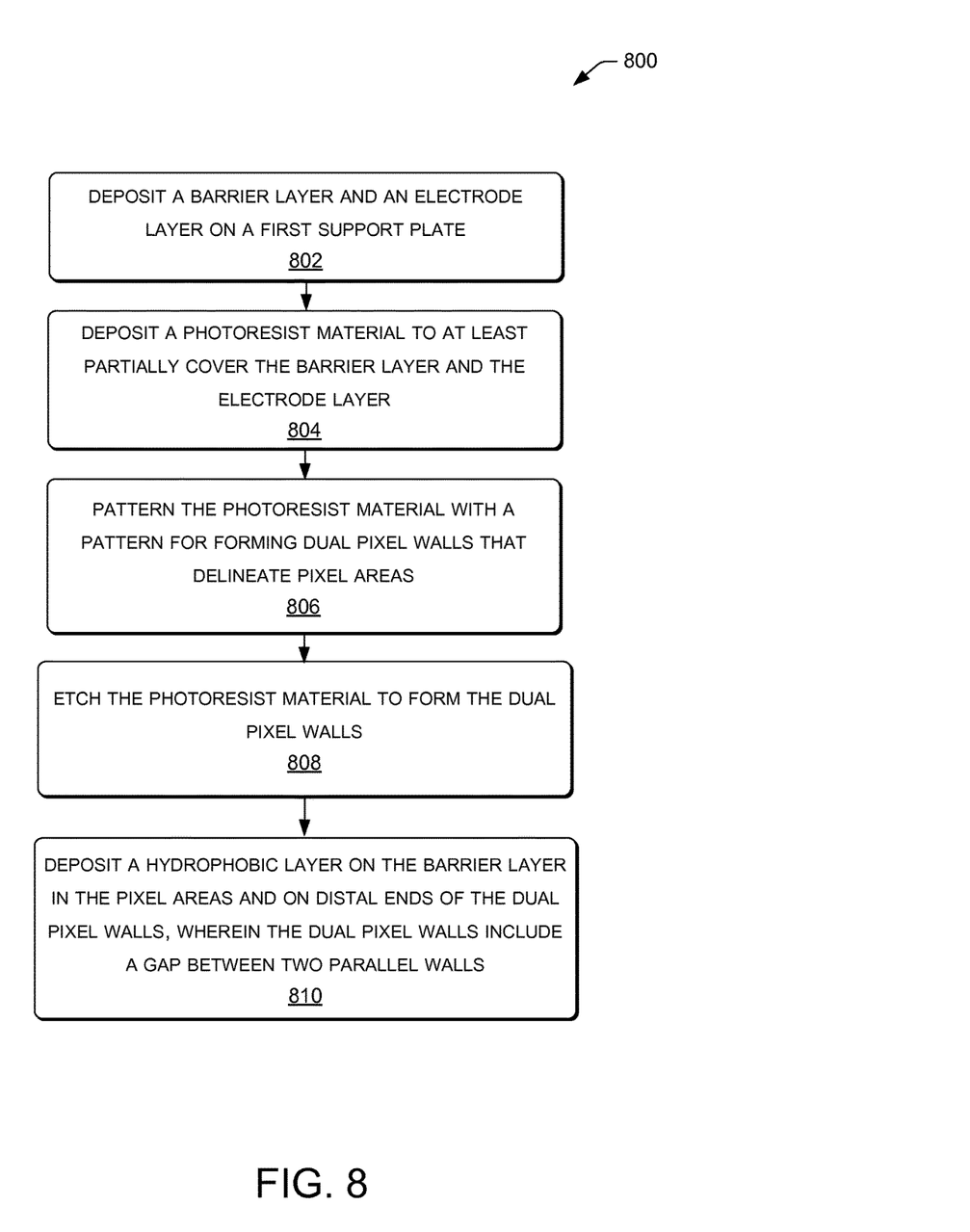
FIG. 8 is a flow diagram of a process for fabricating an electrowetting display device, according to various example embodiments.

FIG. 8 is a flow diagram of a process 800 for fabricating an electrowetting display device, according to various example embodiments. For example, such a process, which may be performed by a fabricator, such as a person, an apparatus, a person operating an apparatus, or a combination thereof, may be similar to or the same as that shown in FIGS. 4-7. At block 802, the fabricator may deposit an electrode layer and a barrier layer on a first support plate. Deposition techniques include, for example, chemical vapor deposition (CVD), physical vapor deposition (PVD), molecular beam epitaxy (MBE), sputtering, and so on. In some examples, an electrode layer may comprise ITO, a metal, or electrically conductive semiconductor material. The barrier layer may comprise a dielectric material such as, for example, SiO$_2$.

At block 804, the fabricator may deposit a photoresist material to at least partially cover the barrier layer and the electrode layer. Any of a number of deposition techniques may be used, such as CVD, PVD, MBE, and sputtering, for example. At block 806, the fabricator may pattern the photoresist material with a pattern for forming dual pixel walls that delineate pixel areas. This patterning process may involve placing an optical mask on the photoresist material, exposing the photoresist material to UV energy, for example, and removing the UV-exposed the photoresist material. At block 808, the fabricator may etch the photoresist material to form the dual pixel walls. At block 810, the fabricator may deposit a hydrophobic layer, such as an amorphous fluoropolymer, which may be the same as or similar to hydrophobic layer 106, illustrated in FIG. 1, on the barrier layer in the pixel areas and on distal ends of the dual pixel walls. Any of a number of deposition techniques may be used, such as CVD, PVD, MBE, and sputtering, for example. The dual pixel walls include a gap between two parallel walls. In some implementations, a hydrophobic layer may be in place before forming the dual pixel walls so that the pixel walls are disposed on the hydrophobic layer.

Figure 9:
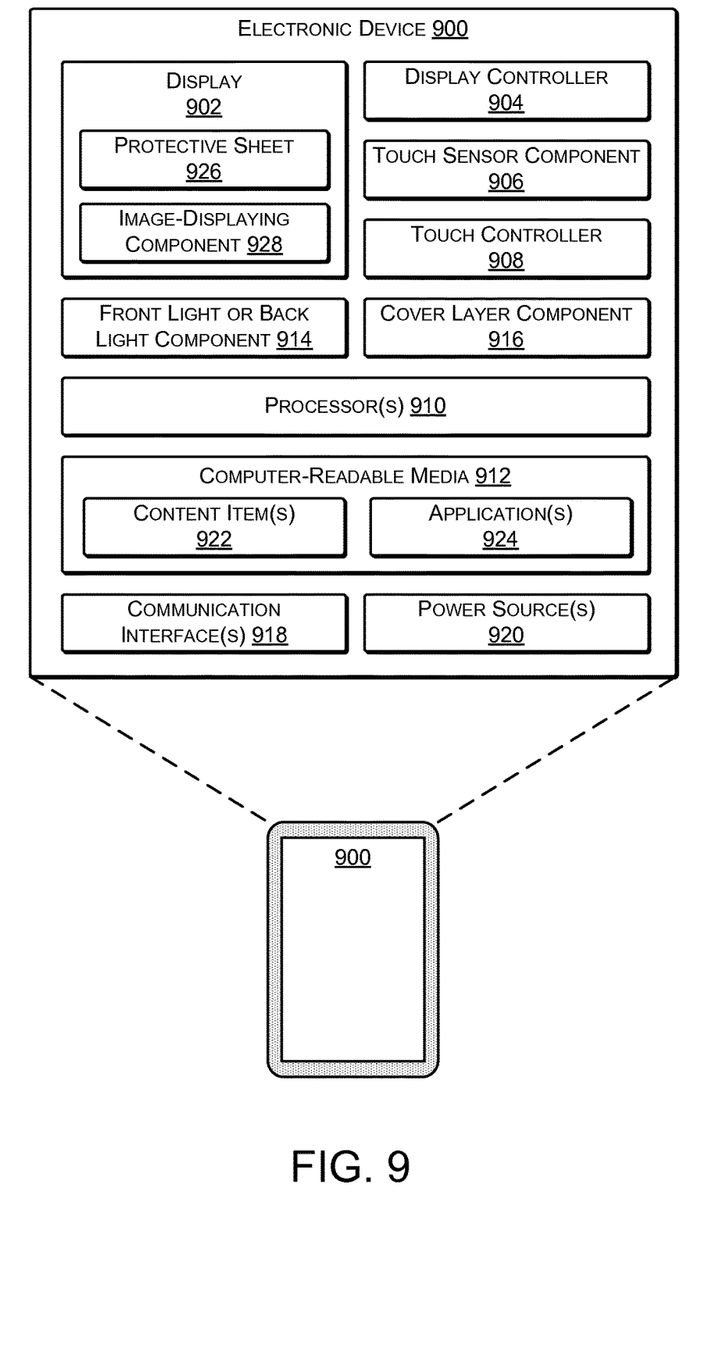
FIG. 9 illustrates an example electronic device that may incorporate a display device, according to some embodiments.

FIG. 9 illustrates an example electronic device 900 that may incorporate any of the display devices discussed above. The device 900 may comprise any type of electronic device having a display. For instance, the device 900 may be a mobile electronic device (e.g., an electronic book reader, a tablet computing device, a laptop computer, a smart phone or other multifunction communication device, a portable digital assistant, a wearable computing device, an automotive display, etc.). Alternatively, the device 900 may be a non-mobile electronic device (e.g., a computer display, a television, etc.). In addition, while FIG. 9 illustrates several example components of the electronic device 900, it is to be appreciated that the device 900 may also include other conventional components, such as an operating system, system busses, input/output components, and the like. Further, in other examples, such as in the case of a television or computer monitor, the electronic device 900 may only include a subset of the components illustrated.

Regardless of the specific implementation of the electronic device 900, the device 900 includes a display 902 and a corresponding display controller 904. The display 902 may represent a reflective or transmissive display In an implementation, the display comprises an electrowetting display that employs an applied voltage to change the surface tension of a fluid in relation to a surface. For example, such an electrowetting display may include the array of pixels 90 illustrated in FIG. 1, though claimed subject matter is not limited in this respect. By applying a voltage across a portion of an electrowetting pixel of an electrowetting display, wetting properties of a surface may be modified so that the surface becomes increasingly hydrophilic. As one example of an electrowetting display, the modification of the surface tension acts as an optical switch by contracting a colored oil film if a voltage is applied to individual pixels of the display. If the voltage is absent, the colored oil forms a continuous film within a pixel, and the color may thus be visible to a user of the display. On the other hand, if the voltage is applied to the pixel, the colored oil is displaced and the pixel becomes transparent. If multiple pixels of the display are independently activated, the display may present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video content.

Of course, while several different examples have been given, it is to be appreciated that while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "black" value of the pixel may correspond to a darkest red of the color filter. Furthermore, while some examples herein are described in the environment of a reflective display, in other examples, the display 902 may represent a backlit display, examples of which are mentioned above.

In addition to including the display 902, FIG. 9 illustrates that some examples of the device 900 may include a touch sensor component 906 and a touch controller 908. In some instances, at least one touch sensor component 906 resides with, or is stacked on, the display 902 to form a touch-sensitive display. Thus, the display 902 may be capable of both accepting user touch input and rendering content in response to or corresponding to the touch input. As several examples, the touch sensor component 906 may comprise a capacitive touch sensor, a force sensitive resistance (FSR), an interpolating force sensitive resistance (IFSR) sensor, or any other type of touch sensor. In some instances, the touch sensor component 906 is capable of detecting touches as well as determining an amount of pressure or force of these touches.

FIG. 9 further illustrates that the electronic device 900 may include one or more processors 910 and one or more computer-readable media 912, as well as a front light component 914 (which may alternatively be a backlight component in the case of a backlit display) for lighting the display 902, a cover layer component 916, such as a cover glass or cover sheet, one or more communication interfaces 918 and one or more power sources 920. The communication interfaces 918 may support both wired and wireless connection to various networks, such as cellular networks, radio, WiFi networks, short range networks (e.g., Bluetooth®), infrared (IR), and so forth.

Depending on the configuration of the electronic device 900, the computer-readable media 912 (and other computer-readable media described throughout) is an example of computer storage media and may include volatile and non-volatile memory. Thus, the computer-readable media 912 may include, but is not limited to, RAM, ROM, EEPROM, flash memory, or other memory technology, or any other medium that may be used to store computer-readable instructions, programs, applications, media items, and/or data which may be accessed by the electronic device 900.

The computer-readable media 912 may be used to store any number of functional components that are executable on the processor 910, as well as content items 922 and applications 924. Thus, the computer-readable media 912 may include an operating system and a storage database to store one or more content items 922, such as eBooks, audio books, songs, videos, still images, and the like. The computer-readable media 912 of the electronic device 900 may also store one or more content presentation applications to render content items on the device 900. These content presentation applications may be implemented as various applications 924 depending upon the content items 922. For instance, the content presentation application may be an electronic book reader application for rending textual electronic books, an audio player for playing audio books or songs, a video player for playing video, and so forth.

In some instances, the electronic device 900 may couple to a cover (not illustrated in FIG. 9) to protect the display (and other components in the display stack or display assembly) of the device 900. In one example, the cover may include a back flap that covers a back portion of the device 900 and a front flap that covers the display 902 and the other components in the stack. The device 900 and/or the cover may include a sensor (e.g., a Hall effect sensor) to detect if the cover is open (i.e., if the front flap is not atop the display and other components). The sensor may send a signal to the front light component 914 if the cover is open and, in response, the front light component 914 may illuminate the display 902. If the cover is closed, meanwhile, the front light component 914 may receive a signal indicating that the cover has closed and, in response, the front light component 914 may turn off.

Furthermore, the amount of light emitted by the front light component 914 may vary. For instance, upon a user opening the cover, the light from the front light may gradually increase to its full illumination. In some instances, the device 900 includes an ambient light sensor (not illustrated in FIG. 9) and the amount of illumination of the front light component 914 may be based at least in part on the amount of ambient light detected by the ambient light sensor. For example, the front light component 914 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of the display 902 may vary depending on whether the front light component 914 is on or off, or based on the amount of light provided by the front light component 914. For instance, the electronic device 900 may implement a larger default font or a greater contrast if the light is off compared to if the light is on. In some instances, the electronic device 900 maintains, if the light is on, a contrast ratio for the display that is within a certain defined percentage of the contrast ratio if the light is off.

As described above, the touch sensor component 906 may comprise a capacitive touch sensor that resides atop the display 902. In some examples, the touch sensor component 906 may be formed on or integrated with the cover layer component 916. In other examples, the touch sensor component 906 may be a separate component in the stack of the display assembly. The front light component 914 may reside atop or below the touch sensor component 906. In some instances, either the touch sensor component 906 or the front light component 914 is coupled to a top surface of a protective sheet 926 of the display 902. As one example, the front light component 914 may include a lightguide sheet and a light source (not illustrated in FIG. 9). The lightguide sheet may comprise a substrate (e.g., a transparent thermoplastic such as PMMA or other acrylic), a layer of lacquer and multiple grating elements formed in the layer of lacquer that function to propagate light from the light source towards the display 902, thus illuminating the display 902.

The cover layer component 916 may include a transparent substrate or sheet having an outer layer that functions to reduce at least one of glare or reflection of ambient light incident on the electronic device 900. In some instances, the cover layer component 916 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3h pencil). Without such scratch resistance, a device may be more easily scratched and a user may perceive the scratches from the light that is dispersed over the top of the reflective display. In some examples, the protective sheet 926 may include a similar UV-cured hard coating on the outer surface. The cover layer component 916 may couple to another component or to the protective sheet 926 of the display 902. The cover layer component 916 may, in some instances, also include a UV filter, a UV-absorbing dye, or the like, for protecting components lower in the stack from UV light incident on the electronic device 900. In still other examples, the cover layer component 916 may include a sheet of high-strength glass having an antiglare and/or antireflective coating.

The display 902 includes the protective sheet 926 overlying an image-displaying component 928. For example, the display 902 may be preassembled to have the protective sheet 926 as an outer surface on the upper or image-viewing side of the display 902. Accordingly, the protective sheet 926 may be integral with and may overlie the image-displaying component 928. The protective sheet 926 may be optically transparent to enable a user to view, through the protective sheet 926, an image presented on the image-displaying component 928 of the display 902.

In some examples, the protective sheet 926 may be a transparent polymer film in the range of 25 to 200 micrometers in thickness. As several examples, the protective sheet may be a transparent polyester, such as polyethylene terephthalate (PET) or polyethylene naphthalate (PEN), or other suitable transparent polymer film or sheet, such as a polycarbonate or an acrylic. In some examples, the outer surface of the protective sheet 926 may include a coating, such as the hard coating described above. For instance, the hard coating may be applied to the outer surface of the protective sheet 926 before or after assembly of the protective sheet 926 with the image-displaying component 928 of the display 902. In some examples, the hard coating may include a photoinitiator or other reactive species in its composition, such as for curing the hard coating on the protective sheet 926. Furthermore, in some examples, the protective sheet 926 may be dyed with a UV-light-absorbing dye, or may be treated with other UV-absorbing treatment. For example, the protective sheet may be treated to have a specified UV cutoff such that UV light below a cutoff or threshold wavelength is at least partially absorbed by the protective sheet 926, thereby protecting the image-displaying component 928 from UV light.

According to some implementations herein, one or more of the components discussed above may be coupled to the display 902 using fluid optically-clear adhesive (LOCA). For example, suppose that the light guide portion of the front light component 914 is to be coupled to the display 902. The light guide may be coupled to the display 902 by placing the LOCA on the outer or upper surface of the protective sheet 926. If the LOCA reaches the corner(s) and/or at least a portion of the perimeter of protective sheet, UV-curing may be performed on the LOCA at the corners and/or the portion of the perimeter. Thereafter, the remaining LOCA may be UV-cured and the front light component 914 may be coupled to the LOCA. By first curing the corner(s) and/or perimeter, the techniques effectively create a barrier for the remaining LOCA and also prevent the formation of air gaps in the LOCA layer, thereby increasing the efficacy of the front light component 914. In other implementations, the LOCA may be placed near a center of the protective sheet 926, and pressed outwards towards a perimeter of the top surface of the protective sheet 926 by placing the front light component 914 on top of the LOCA. The LOCA may then be cured by directing UV light through the front light component 914. As discussed above, and as discussed additionally below, various techniques, such as surface treatment of the protective sheet, may be used to prevent discoloration of the LOCA and/or the protective sheet 926.

While FIG. 9 illustrates a few example components, the electronic device 900 may have additional features or functionality. For example, the device 900 may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within the device 900 may reside remotely from the device 900 in some implementations. In these implementations, the device 900 may utilize the communication interfaces 918 to communicate with and utilize this functionality.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. An electrowetting display device comprising:
    a bottom support plate;
    a top support plate positioned above the bottom support plate and substantially parallel to the bottom support plate, wherein space between the bottom support plate and the top support plate includes a plurality of pixel regions for presenting content on the electrowetting display device;
    two substantially parallel walls separated by a gap, wherein
        the two substantially parallel walls separated by the gap separate a first pixel region and a second pixel region adjacent to the first pixel region,
        the first pixel region includes a first portion of a first pixel electrode disposed on a side of the bottom support plate facing the top support plate,
        the second pixel region includes a first portion of a second pixel electrode disposed on the side of the bottom support plate facing the top support plate, and
        the two substantially parallel walls comprise a first wall that is disposed over a second portion of the first pixel electrode and a second wall that is disposed over a second portion of the second pixel electrode.

2. The electrowetting display device of claim 1, wherein the electrolyte solution is disposed between the two parallel walls.

3. The electrowetting display device of claim 1, further comprising:
    a first hydrophobic layer disposed on the first portion of the first pixel electrode; and
    a second hydrophobic layer disposed on the first portion of the second pixel electrode.

4. The electrowetting display device of claim 3, further comprising a third hydrophobic layer portion disposed on top surfaces of the two parallel walls.

5. The electrowetting display device of claim 3, further comprising a third hydrophobic layer portion disposed on a floor of the gap between the two parallel walls.

6. An electrowetting display device comprising:
    a first support plate and a second support plate;
    pixel regions between the first support plate and the second support plate;
    a first portion of a first electrode layer disposed on the first support plate in a first pixel region;
    a first portion of a second electrode layer disposed on the first support plate in a second pixel region that is adjacent to the first pixel region;
    two walls separated by a gap, wherein the two walls comprise a first wall disposed over a second portion of the first electrode layer and a second wall disposed over a second portion of the second electrode layer, and wherein the two walls separate the first and second pixel regions from each other; and
    a fluid disposed between the first support plate and the second support plate and in the gap that separates the two walls.

7. The electrowetting display device of claim 6, wherein:
the first wall has a side facing the gap and the second wall has a side facing the gap; and
the side of the first wall facing the gap and the side of the second wall facing the gap are hydrophilic to the fluid.

8. The electrowetting display device of claim 6, further comprising a hydrophobic layer disposed on the first support plate.

9. The electrowetting display device of claim 8, further comprising a dielectric barrier layer disposed between the hydrophobic layer and the first support plate, wherein the two walls are disposed directly on the dielectric barrier layer or the electrode layer.

10. The electrowetting display device of claim 6, further comprising a hydrophobic layer disposed on the first support plate in the gap between the two walls.

11. The electrowetting display device of claim 6, further comprising a hydrophobic layer disposed on the top surfaces of the two walls.

12. The electrowetting display device of claim 6, wherein a width of the two walls is in a range from about 4 microns up to about 7 microns, and a width of the gap is in a range from about 1 micron up to about 3 microns.

13. The electrowetting display device of claim 6, wherein the two walls are substantially parallel with each other.

14. An electrowetting display device comprising:
a first pixel region disposed on a support plate;
a second pixel region disposed on the support plate;
two walls protruding from the support plate and separated by a gap, the two walls residing between the first pixel region and the second pixel region;
a fluid disposed on the support plate in the gap that separates the two walls; and
a hydrophobic layer disposed on top surfaces of the two walls.

15. The electrowetting display device of claim 14, wherein
the support plate includes a second hydrophobic layer in contact with the fluid.

16. The electrowetting display device of claim 15, further comprising a dielectric barrier layer and an electrode layer disposed between the second hydrophobic layer and the support plate.

17. The electrowetting display device of claim 14, wherein:
the two walls comprise a first wall and a second wall,
the first wall has a side facing the gap and the second wall has a side facing the gap; and
the side of the first wall facing the gap and the side of the second wall facing the gap are hydrophilic to the fluid.

18. The electrowetting display device of claim 14, wherein the two walls comprise a photoresist material.

19. The electrowetting display device of claim 14, wherein the fluid disposed in the gap that separates the two walls comprises an electrolyte solution.

20. The electrowetting display device of claim 14, further comprising a top support plate, wherein the top support plate and the support plate at least partially enclose the pixel regions, the two walls separated by the gap, and the fluid.

\* \* \* \* \*